US012607928B2

(12) United States Patent
Quaade et al.

(10) Patent No.: US 12,607,928 B2
(45) Date of Patent: Apr. 21, 2026

(54) METASURFACE COATINGS

(71) Applicant: NIL Technology ApS, Kongens Lyngby (DK)

(72) Inventors: Ulrich Quaade, Bagsvaerd (DK); Villads Egede Johansen, Copenhagen (DK)

(73) Assignee: NIL Technology ApS, Kongens Lyngby (DK)

( * ) Notice: Subject to any disclaimer, the term of this patent is extended or adjusted under 35 U.S.C. 154(b) by 144 days.

(21) Appl. No.: 17/913,953

(22) PCT Filed: Jan. 19, 2021

(86) PCT No.: PCT/EP2021/051029
§ 371 (c)(1),
(2) Date: Sep. 23, 2022

(87) PCT Pub. No.: WO2021/197677
PCT Pub. Date: Oct. 7, 2021

(65) Prior Publication Data
US 2023/0118541 A1     Apr. 20, 2023

Related U.S. Application Data

(60) Provisional application No. 63/004,056, filed on Apr. 2, 2020.

(51) Int. Cl.
*H10F 39/00*       (2025.01)
*B82Y 20/00*       (2011.01)
(Continued)

(52) U.S. Cl.
CPC .......... *G03F 7/0002* (2013.01); *G03F 7/0005* (2013.01); *G03F 7/0017* (2013.01);
(Continued)

(58) Field of Classification Search
CPC .... G03F 7/0002; G03F 7/0005; G03F 7/0017; H01L 27/14625; H01L 33/58;
(Continued)

(56) References Cited

U.S. PATENT DOCUMENTS

| | | |
|---|---|---|
| 2004/0192041 A1 | 9/2004 | Jeong et al. |
| 2007/0232738 A1 | 10/2007 | Bratkovski et al. |

(Continued)

FOREIGN PATENT DOCUMENTS

| | | |
|---|---|---|
| CN | 110476090 A | 11/2019 |
| JP | H07-306318 A | 11/1995 |

(Continued)

OTHER PUBLICATIONS

Office Action in Japanese Appln. No. 2022-560066, mailed on Jul. 2, 2024, 8 pages (with machine translation).
(Continued)

*Primary Examiner* — Courtney D Thomas
(74) *Attorney, Agent, or Firm* — Fish & Richardson P.C.

(57) ABSTRACT

A method includes providing a coating (208) over a first surface (202) of a substrate (204) and over a metasurface (200) on the first surface of the substrate; and imprinting the coating to cause a surface of the coating to have a predetermined characteristic. A device includes a substrate; a metasurface on a first surface of the substrate; and a coating on the metasurface and on the first surface of the substrate, a surface of the coating defining a functional structure.

10 Claims, 6 Drawing Sheets

(51) Int. Cl.
    *G03F 7/00*        (2006.01)
    *H10H 20/855*     (2025.01)

(52) U.S. Cl.
    CPC ......... *H10F 39/806* (2025.01); *H10H 20/855*
        (2025.01); *B82Y 20/00* (2013.01)

(58) Field of Classification Search
    CPC ............. H01L 27/146; H01L 27/14601; H01L
        27/14627; H01L 2933/0058; H01L
        21/0276; B82Y 20/00; B29C 59/026;
        B29C 2059/023; H01S 5/0225; H10F
        39/806; H10F 39/12; H10F 39/80; H10F
        39/8063; H10H 20/855; H10H 20/0363;
        G02B 1/002; G02B 5/008; G02B 5/0221
    See application file for complete search history.

(56)          References Cited

U.S. PATENT DOCUMENTS

| | | |
|---|---|---|
| 2008/0176049 A1 | 7/2008 | Ro et al. |
| 2009/0015142 A1 | 1/2009 | Potts et al. |
| 2011/0166045 A1* | 7/2011 | Dhawan ................ H01L 29/068 |
| | | 257/467 |
| 2015/0219806 A1 | 8/2015 | Arbabi et al. |
| 2017/0131460 A1 | 5/2017 | Lin et al. |
| 2018/0119139 A1 | 5/2018 | Bowen et al. |
| 2018/0240653 A1 | 8/2018 | Akselrod et al. |
| 2019/0386749 A1 | 12/2019 | Lezec et al. |
| 2020/0264343 A1* | 8/2020 | Han ......................... G02B 1/14 |

FOREIGN PATENT DOCUMENTS

| | | |
|---|---|---|
| JP | 2009092860 | 4/2009 |
| JP | 2010260272 | 11/2010 |
| JP | 2016185699 | 10/2016 |
| JP | 2018519542 | 7/2018 |
| JP | 2018533030 | 11/2018 |
| KR | 101183882 | 9/2012 |
| KR | 20190107116 A | 9/2019 |
| TW | 201140889 | 11/2011 |
| WO | WO 2015/166852 | 11/2015 |

OTHER PUBLICATIONS

International Search Report and Written Opinion in International Appln. No. PCT/EP2021/051029, dated May 11, 2021, 14 pages.
Office Action in Taiwanese Appln. No. 110103403, dated Apr. 22, 2022, 16 pages (with English Translation).
International Preliminary Report on Patentability in International Appln. No. PCT/EP2021/051029, dated Oct. 13, 2022, 9 pages.
Office Action in Taiwanese Appln. No. 110103403, mailed on May 9, 2023, 3 pages (with English Translation).
Office Action in Japanese Appln. No. 2022-560066, mailed on Dec. 3, 2024, 8 pages (with machine translation).
Office Action in Chinese Appln. No. 202180025527.8, mailed on Jun. 20, 2025, 24 pages (with English translation).
Office Action in Korean Appln. No. 10-2022-7038043, mailed on Sep. 2, 2025, 15 pages (with English translation).

* cited by examiner

METASURFACE COATINGS

CROSS-REFERENCE TO RELATED APPLICATIONS

This application is a National Stage Application under 35 U.S.C. § 371 and claims the benefit of International Application No. PCT/EP2021/051029, filed Jan. 19, 2021, which claims priority to U.S. Application No. 63/004,056, filed Apr. 2, 2020, the disclosure of which is incorporated herein by reference.

BACKGROUND

Metasurfaces are surfaces with distributed nanostructures that can be arranged to interact with light in a particular manner. In some cases, metasurfaces are overlaid with a coating. Coatings with particular characteristics may provide beneficial effects.

SUMMARY

In one aspect, the present disclosure describes a method that includes providing a coating over a first surface of a substrate and over a metasurface on the first surface of the substrate; and imprinting the coating to cause a surface of the coating to have a predetermined characteristic.

Implementations of the method may include one or more of the following. Imprinting the coating includes pressing a face of a stamp into the surface of the coating, in which the face includes a structure to impart the predetermined characteristic to the surface of the coating. The predetermined characteristic includes a roughness that is less than a predetermined maximum roughness.

In some implementations, the predetermined characteristic includes an optical structure defined by the surface of the coating. The optical structure includes a diffractive optical structure. The optical structure includes a lens. The optical structure includes an anti-reflection structure. The optical structure includes features having a dimension between 10 nm and 100 nm. The predetermined characteristic includes hydrophobicity or hydrophilicity. Imprinting the coating causes the coating to have a predetermined thickness.

In some implementations, imprinting the coating includes pressing a face of a stamp into the surface of the coating, in which the face includes a spacer, in which the face is pressed into the surface of the coating until an end of the spacer contacts the first surface of the substrate, and in which a height of the spacer is equal to the predetermined thickness. Imprinting the coating includes pressing a face of a stamp into the surface of the coating, in which a spacer is on the first surface of the substrate, in which the face is pressed into the surface of the coating until an end of the spacer contacts the face of the stamp, and in which a height of the spacer is equal to the predetermined thickness.

In some implementations, the coating includes a polymer. The metasurface includes nanostructures operable to interact with a light wave so as to change at least one of an amplitude or a phase of the light wave. Imprinting the coating causes the surface of the coating to be parallel to the first surface of the substrate. The method includes providing a second coating on a second surface of the substrate, the second surface of the substrate being on an opposite side of the substrate from the first surface of the substrate; and imprinting the second coating to cause a surface of the second coating to have a second predetermined characteristic.

The disclosure also describes a device that includes a substrate; a metasurface on a first surface of the substrate; and a coating on the metasurface and on the first surface of the substrate, a surface of the coating defining a functional structure.

In some implementations, the surface of the coating defines an optically functional structure. The optically functional structure includes a diffractive optical structure. The optically functional structure includes an optical lens. The optically functional structure includes an anti-reflection structure. The functional structure includes a hydrophobic structure or a hydrophilic structure. The functional structure includes features having a dimension between 10 nm and 100 nm. The coating includes a polymer.

In some implementations, the metasurface includes nanostructures operable to interact with a light wave so as to change at least one of an amplitude or a phase of the light wave. The surface of the coating has a roughness that is less than a predetermined maximum roughness. The device includes a second coating on a second surface of the substrate, the second surface of the substrate being on an opposite side of the substrate from the first surface of the substrate, in which a surface of the second coating defines a second functional structure. The coating has a thickness of greater than 10 microns.

The disclosure also describes a system that includes a coating deposition device; a stamp aligner; and a controller communicatively coupled with the stamp aligner and the coating deposition device, in which the system is configured to perform operations including: providing a coating over a first surface of a substrate and over a metasurface on the first surface of the substrate; and imprinting the coating to cause a surface of the coating to have a predetermined characteristic.

The disclosure also describes modules. For example, a module can include a light-emitting device; and a metasurface device, in which the metasurface device includes a substrate, a metasurface on a first surface of the substrate, and a coating on the metasurface and on the first surface of the substrate, a surface of the coating defining a functional structure, and in which the metasurface device is configured to interact with light generated by the light-emitting device.

The disclosure further describes a module that includes a light-sensitive device; and a metasurface device, in which the metasurface device includes a substrate, a metasurface on a first surface of the substrate, and a coating on the metasurface and on the first surface of the substrate, a surface of the coating defining a functional structure, and in which the metasurface device is configured to interact with light incident on the module, and to transmit modified light to the light-sensitive device.

Particular implementations of the subject matter described in this disclosure can be implemented to realize one or more advantages. For example, in some implementations, a coating may protect underlying nanostructures of a metasurface from mechanical damage. In some implementations, the coating may be composed of a cost-effective material. In some implementations, imprinting the coating is a more cost-effective means of surface modification than alternative fabrication methods. In some implementations, the coating may protect the metasurface from undergoing chemical reactions. In some implementations, a surface of the coating may incorporate optical functionality, non-optical functionality, or both optical and non-optical functionalities. In some implementations, a more uniform coating thickness can be maintained across a substrate surface. In some implementations, the coating surface can be made to have a lower roughness and/or a higher flatness. In some implementations, the coating surface can be caused to have a particular characteristic when multiple coatings are provided on a metasurface. In some implementations, coatings may be provided on multiple surfaces of a substrate.

The details of one or more implementations are set forth in the accompanying drawings and the description below. Other aspects, features and advantages will be apparent from the description and drawings, and from the claims.

DETAILED DESCRIPTION

The present disclosure relates to coatings formed on metasurfaces. In particular implementations, this disclosure describes imprinting a coating formed on a metasurface to cause a surface of the coating to have a predetermined characteristic.

Metasurfaces are surfaces with distributed arrays of nanostructures. The nanostructures may, individually or collectively, interact with light waves. For example, the nanostructures may change a local amplitude, a local phase, or both, of an incoming light wave.

When the nanostructures are arranged in particular patterns, the metasurface may act as an optical element such as a lens, lens array, beam splitter, diffuser, polarizer, or other optical element. In some instances, metasurfaces may perform optical functions that are traditionally performed by refractive and/or diffractive optical elements. However, metasurfaces also can perform other functions, including polarization control, negative refractive index transmission, beam deflection, vortex generation, polarization conversion, optical filtering, and plasmonic optical functions.

Nanostructures may be mechanically delicate. For example, nanostructures on a surface of a substrate may become detached from the substrate by mechanical stress (e.g., a scrape along the surface, or pressure exerted upon the nanostructures towards the substrate). In some cases, nanostructures also may be chemically unstable, such that the nanostructures react with their ambient surroundings in an undesirable way (e.g., oxidize when in contact with water or atmospheric oxygen).

In addition, contaminants on the nanostructures may damage the nanostructures mechanically and/or chemically, or may impair the proper optical functioning of the nanostructures. Inoperable nanostructures may, besides leading to a non-working device, compromise safety. For example, a laser beam may be deflected, by a drop of water on a metasurface, into an eye of a user. As another example, a wet metasurface has a changed refractive index surrounding the metasurface, the changed refractive index altering the optical properties of the metasurface and leading to collimated light passing through the metasurface and into an eye of a user.

Therefore, in some cases, it can be beneficial to apply protective coatings on metasurfaces, and, further, to perform processing steps upon the coatings in order to impart predetermined characteristics to the coatings.

Figures 1A, 1B, 1C, 1D:
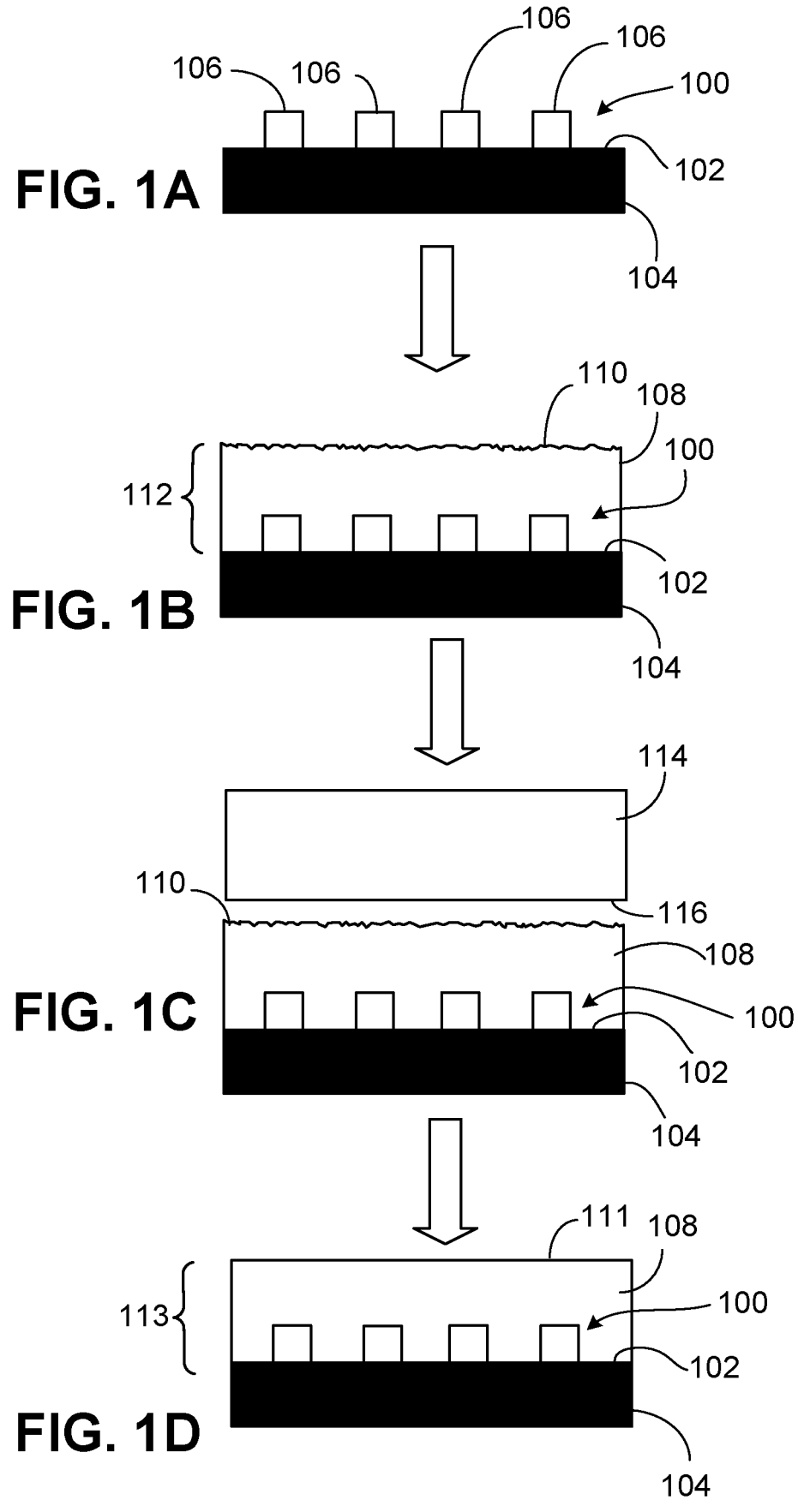
FIGS. 1A-1D are schematics showing an example of an imprinting process on a coating.

As shown in FIG. 1A, some implementations include a metasurface 100 on a surface 102 of a substrate 104. The metasurface 100 includes multiple individual nanostructures 106.

Each nanostructure 106 may be, for example, a protruding post or other structure having a defined shape. In some implementations, the nanostructures 106 are L-shaped, V-shaped, and/or U-shaped. In some implementations, the nanostructures 106 are arranged in a two-dimensional (2D) array on the substrate surface 102. In some implementations, the nanostructure 106 are strips arranged in a one-dimensional (1D) array on the substrate surface 102. In some implementations, the nanostructures 106 are arranged in other patterns, e.g., in concentric rings. In some cases, each nanostructure 106 may function, for example, as an antenna.

Each nanostructure 106 may have dimensions of, for example, tens of nanometers (nm) or hundreds of nm. In some implementations, each nanostructure 106 has a dimension between 10 nm and 100 nm. In some implementations, each nanostructure 106 has a dimension between 100 nm and 500 nm. In some implementations, each nanostructure 106 has a dimension of less than 1 μm. In some implementations, each nanostructure 106 has a dimension of less than 10 μm. The dimensions of the nanostructures may differ for other implementations.

The metasurface 100 may be fabricated, for example, using additive lithography, subtractive lithography, or both. The metasurface 100 may include, for example, one or more of plasmonic materials (e.g., aluminum-doped zinc oxide), semiconductors (e.g., silicon), and dielectrics (e.g., silicon oxide).

The substrate 104 may be, for example, a semiconductor substrate, e.g., a silicon wafer. In some implementations, the substrate 104 is a flexible substrate, e.g., plastic.

In some implementations, the substrate 104 includes other features and structures not shown in FIG. 1A. For example, the substrate 104 may include a laser that generates light that interacts with the metasurface 100. As another example, the substrate 104 may include an on-chip waveguide that directs light to the metasurface 100.

As shown in FIG. 1B, a coating 108 is provided over the substrate surface 102 and over the metasurface 100.

In some implementations, the coating 108 is a polymer deposited by spin-coating. In some implementations, the coating 108 is deposited using spray deposition, dip-coating, printing, or a vapor deposition process (e.g., chemical or physical vapor deposition). The coating 108 may include, for example, one or more of a polymer, a spin-on glass, nanoparticles dispersed in a solvent, another spin-coatable material, or a material deposited by means other than spin-coating.

Materials besides polymers also may be used for the coating 108. If the coating 108 is to be imprinted, the material may be a material that is deposited soft and later hardens (or can be hardened). If the coating 108 is not processed using imprinting, the coating 108 may be any material that is sufficiently physically and chemically resistant, has optical characteristics that do not interfere with proper operation of the metasurface 100, and has a surface that may be functionalized, as described below.

The coating 108 may be composed of a material with particular characteristics. For example, the coating 108 may be optically transparent, either in a broad band or in a narrow band appropriate to a particular functionality (e.g., transparent in an optical band in which the underlying metasurface 100 is optically operable). The coating 108 may be chemically and/or physically resistant and durable, so as to protect the underlying metasurface 100. The coating 108 may be relatively chemically-impermeable, so as to prevent ambient chemicals (e.g., atmospheric oxygen) from penetrating the coating 108 and chemically interacting with the metasurface 100. The coating 108 may be electrically insulating. The coating 108 may be thermally insulating or thermally conductive (e.g., if the coating 108 is thermally conductive, the coating may enhance device cooling).

After providing the coating 108, the coating 108 may be characterized by one or more parameters. For example, a surface 110 of the coating may be characterized by a roughness (e.g., a root mean squared roughness) that describes typical roughness across the coating surface 110. Surface roughness may be largely unavoidable at this point in a fabrication process, e.g., intrinsic to the coating deposition method used or to the choice of coating material. A coating surface 110 with too high of a roughness may cause undesired optical effects, e.g., deflection or reflection. The coating surface 110 may, for example, have a roughness above a desired maximum roughness.

After providing the coating 108, the coating 108 also may be characterized by one or more thicknesses 112. The coating 108 may have a thickness 112 that is substantially the same across the coating 108, or the thickness 112 may vary. For example, in implementations in which the coating 108 is deposited by spin-coating, the thickness 112 may vary along a radius of spin. In some implementations, an as-deposited coating 108 may have an even thickness 112 that is difficult to control precisely. A coating 108 having an undesired thickness 112, or having an uneven thickness 112, may cause undesired optical effects, e.g., reflection.

Structures underlying the coating 108 may cause the coating 108 to have a varying thickness 112 and/or a high roughness. For example, if the coating 108 is deposited using vapor deposition, the coating 108 may conformally coat rough or uneven surfaces underlying the coating 108, such that the coating 108 itself is rough or has an uneven thickness.

In some implementations, at least in order to control the roughness and/or thickness of the coating 108, the coating 108 is imprinted using a stamp 114, as shown in FIG. 1C. A face 116 of the stamp 114 is brought into contact with the coating surface 110, and the stamp 114 is pressed towards the substrate surface 102. The imprinting can impart a predetermined or specified characteristic to the coating surface 110.

In some implementations, the stamp 114 is pressed towards the substrate surface 102 with a predetermined pressure or to a predetermined spatial extent. In some implementations, the stamp 114 is heated before or during the imprinting such that the stamp 114 is at an elevated temperature during the imprinting. This may cause the coating 108 to soften and to be more easily shaped by the stamp 114. In some implementations, the coating 108 is at an elevated temperature during the imprinting. In some implementations, the stamp is pressed against the coating 108 for a predetermined amount of time. In some implementations, ultra-violet (UV) imprinting can be used, for example, as an alternative to thermal imprinting. UV imprinting generally involves pressing the stamp into the coating 108, while the coating is in a deformable state, and then applying UV radiation to cure the coating.

As shown in FIG. 1D, when the stamp 114 is removed after the imprinting, the coating 108 has a relatively smooth coating surface 111. The smooth coating surface 111 is imparted by the corresponding smooth face 116 of the stamp 114, i.e., a structure of the face 116 imparts a corresponding structure to the coating 108. After the imprinting, the coating surface 111 may be sufficiently smooth such that the post-imprinting coating surface 111 has, for example, a roughness that is less than a desired specified maximum roughness. In some implementations, the roughness is small enough so as to not degrade the desired optical function of the device, e.g., by undesired scattering of light. In some implementations, the roughness is less than 50 ÅRMS, less than 20 ÅRMS, less than 10 ÅRMS, less than 5 ÅRMS, less than 1 ÅRMS, or less than 0.1 ÅRMS.

The roughness may be characterized on portions of the coating surface 111 that do not include structures intentionally defined by the surface of the coating, as described below in relation to FIGS. 2A-2B.

In some implementations, the imprinting imparts an optically flat surface. For example, when $\lambda$ is a wavelength of light with which the metasurface is configured to interact, the coating surface 111 may have a flatness less than $\lambda$, less than $\lambda/2$, less than $\lambda/4$, less than $\lambda/20$, or less than $\lambda/100$.

After the imprinting, the coating 108 also can have a defined thickness 113, for example, that corresponds to a distance to which the stamp 114 was pressed towards the substrate surface 102. In some implementations, the defined thickness 113 corresponds to a minimum distance, during the imprinting, between the face 116 of the stamp 114 and the substrate surface 102.

In some implementations, the thickness 113 is greater than 1 micron. For example, in some implementations, the coating 108 has a thickness 113 between 1 micron and 10 microns. In some implementations, the thickness 113 is greater than 10 microns. For example, in some implementations, the thickness 113 is between 10 microns and 50 microns. In some implementations, the thickness 113 is greater than 50 microns. In some implementations, the thickness 113 is optically thick, e.g., thicker than several wavelengths of light that interact with the metasurface 100.

In some implementations, the coating 108 is less than 1 micron. In some implementations, the coating 108 is an anti-reflection coating, e.g., a quarter-wavelength anti-reflection coating.

In some implementations, the coating 108 provides an optical effect that may modify the optical functioning of the metasurface 100. For example, the coating 108 may have a refractive index that alters interactions between light and the metasurface 100. The metasurface 100 may be designed to take into account optical effects caused by the coating 108.

In some implementations, after the imprinting, the coating surface 111 is substantially parallel to the substrate surface 102. This may cause light incident on the coating surface 111 to be deflected less with respect to the metasurface—100 than if the coating surface 111 were non-parallel to the substrate surface 102.

In some implementations, the coating 108 is cured or otherwise hardened before the imprinting, after the imprinting, or both before and after the imprinting. The curing may include, for example, a thermal cure or an optical cure (e.g., an ultraviolet (UV) cure).

In some implementations, depositing a polymer coating and imprinting the polymer coating may be faster and/or more cost-efficient than alternative materials and/or fabrication techniques. For example, the polymer coating may be deposited on an entire wafer, and a stamp may imprint the coating across the entire wafer in a single imprinting step, to create an even coating thickness on wafer scale. The wafer may then be diced into individual devices. In contrast, some other fabrication techniques (e.g., photolithography performed on a polymer coating, or photolithography performed on a non-polymer coating) may be slower and/or more expensive. In combination with the imprinting processes described in this disclosure, a polymer coating may be particularly advantageous, at least because the polymer coating can be deposited in a malleable (e.g., soft) state conducive to imprinting.

In some implementations, the coating 108 is provided on only a portion of the substrate 104. In some implementations, portions of the coating 108 are removed from portions of the substrate 104.

Figures 2A, 2B:
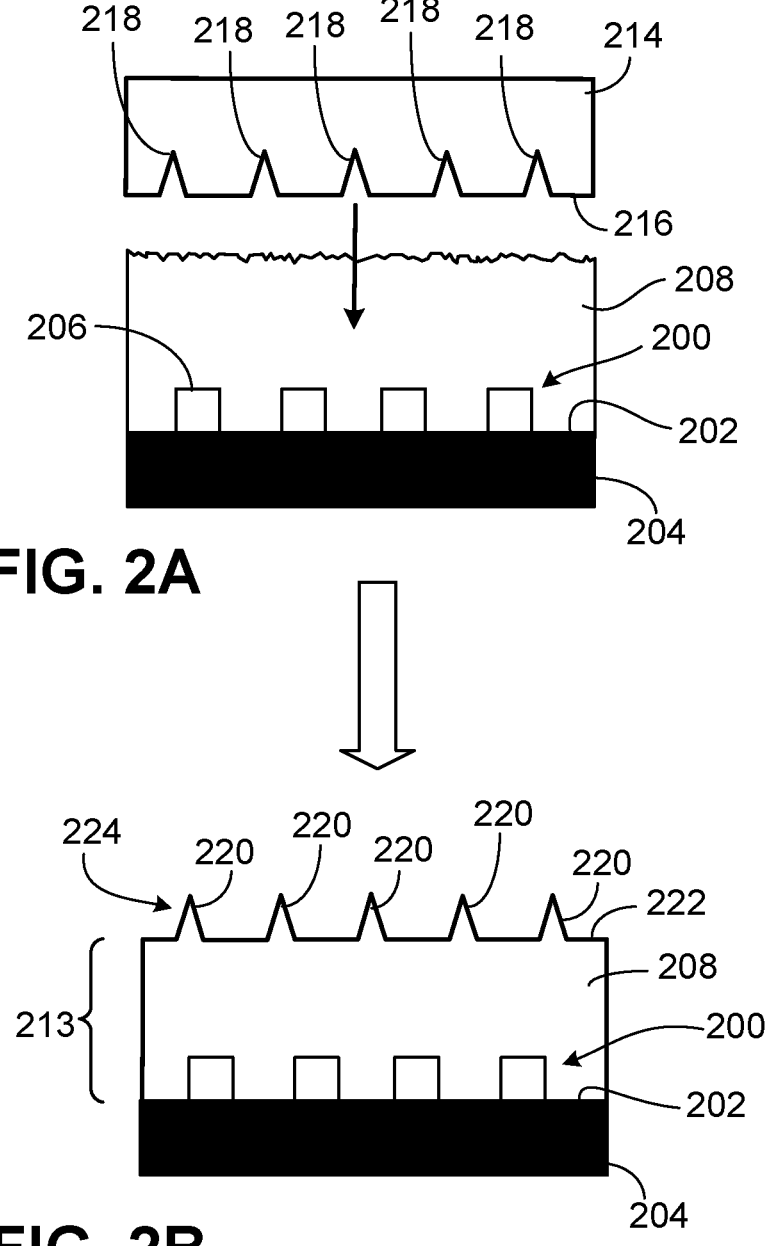
FIGS. 2A-2B are schematics showing another example of an imprinting process on a coating.

FIGS. 2A-2B show a process for providing a functionalized coating on a metasurface. In FIG. 2A, a metasurface 200 is on a substrate surface 202 of a substrate 204. A coating 208 is on the metasurface 200 and the substrate surface 202, and may have been provided using, for example, the methods described above for coating 108.

A stamp 214 is used to imprint the coating 208 to fabricate the device shown in FIG. 2B. A face 216 of the stamp has a structure incorporating features 218, and the imprinting causes corresponding features 220 to be imparted to the coating surface 222 shown in FIG. 2B. Each feature 218 defined by the face 216 of the stamp may have dimensions (for example, a depth or a lateral width) of tens of nm or hundreds of nm. In some implementations, each feature 218 has a dimension between 10 nm and 100 nm. In some implementations, each feature 218 has a dimension between 100 nm and 500 nm. In some implementations, each feature 218 has a dimension of less than 1 μm. In some implementations, each features 218 has a dimension of less than 10 μm. The foregoing dimensions may differ for other implementations.

The features 220 define a patterned structure 224 having one or more functionalities. In some implementations, the functionality is an optical functionality. For example, the patterned structure 224 may include a diffractive optical element. The patterned structure 224 may include one or more of (or, equivalently, perform the functions of one or more of) a beamsplitter, a diffractive lens, a microlens, an optical diffuser, or another optical device. In the case of a diffractive lens, for example, the patterned structure 224 may include concentric rings of features 220 having varied heights and widths configured to minimize aberration and/or directly focus light.

The patterned structure 224 itself may be a metasurface. For example, each feature 220 may be a nanostructure, and the features 220 may, individually or collectively, interact with light waves. In some instances, the features 220 may change a local amplitude, a local phase, or both, of an incoming light wave. Each feature 220 may have dimensions of tens of nm or hundreds of nm. In some implementations, each feature 220 has a dimension between 10 nm and 100 nm. In some implementations, each feature 220 has a dimension between 100 nm and 500 nm. In some implementations, each feature 220 has a dimension of less than 1 μm. In some implementations, each feature 220 has a dimension of less than 10 μm. The foregoing dimensions may differ for some other implementations.

Further, in some cases, each feature 220 may have a dimension that is smaller than a wavelength of light that interacts with the metasurface 200. Further, in some instances, each feature 220 may have dimensions that are similar to dimensions of nanostructures 206 of the metasurface 200.

Functionalities of the patterned structure 224 may include diffraction and antireflection. For example, the patterned structure 224 may include a diffraction grating. The patterned structure 224 may include surface texturing that gives rise to antireflection properties. For example, each feature 220 may be a pyramid, such that the coating 208, after imprinting, is an antireflection coating based on the pyramids reflecting light.

In some implementations, the coating 208 is thinner than conventional optics configured to provide the optical functionalities of the coating 208. For example, the patterned structure 224 may include a lens, and the coating 208 may be thinner than a discrete lens having the same optical effects as the lens of the patterned structure 224. By decreasing a necessary height of a device including the coating 208, the coating 208 may provide a space-saving advantage.

In some implementations, the patterned structure 224 has non-optical functionalities. For example, the patterned structure 224 may be hydrophobic (e.g., include an array of posts that decreases a contact area for a liquid on the coating surface 222). The patterned structure 224 may be hydrophilic. The patterned structure 224 may be self-cleaning (e.g., include nanostructures to create a hydrophobic surface).

The post-imprinting coating 208 may, in addition to including the patterned structure 224, have a set thickness 213 defined by the imprinting process, as described in reference to FIGS. 1A-1D.

Although FIG. 2B shows identical features 220 defined by the coating surface 222, in some implementations there are a variety of different features defined by the coating surface, the features individually or collectively performing multiple functions.

"Imprinting," as used in this disclosure, should be understood to include other processes that may cause a surface of a coating on a metasurface and substrate surface to have a predetermined characteristic, as shown in FIGS. 1D and 2B. For example, "imprinting" may include one or more of embossing, debossing, and nano-imprinting. Although this disclosure shows examples of a stamp moving towards a substrate, in some implementations, the substrate is moved towards the stamp.

In addition, although the devices shown in FIGS. 1D, 2B, and throughout this disclosure are described as being fabricated using an imprinting process, the devices are themselves a subject of this disclosure. A device including a substrate, a metasurface on a surface of the substrate, and a coating on the metasurface and on the surface of the substrate may provide the advantages and have the features described elsewhere in this disclosure, regardless of a method of fabrication of the device. For example, a surface of the coating may define a functional structure, as described elsewhere in this disclosure. The coating may be fabricated using non-imprinting methods while still being within the scope of devices described in this disclosure.

In some implementations, the stamp 214 is composed of silicon and/or glass. In some implementations, the stamp 214 is a working stamp (e.g., nickel shim) having a structure established by a master stamp.

Figures 3A, 3B:
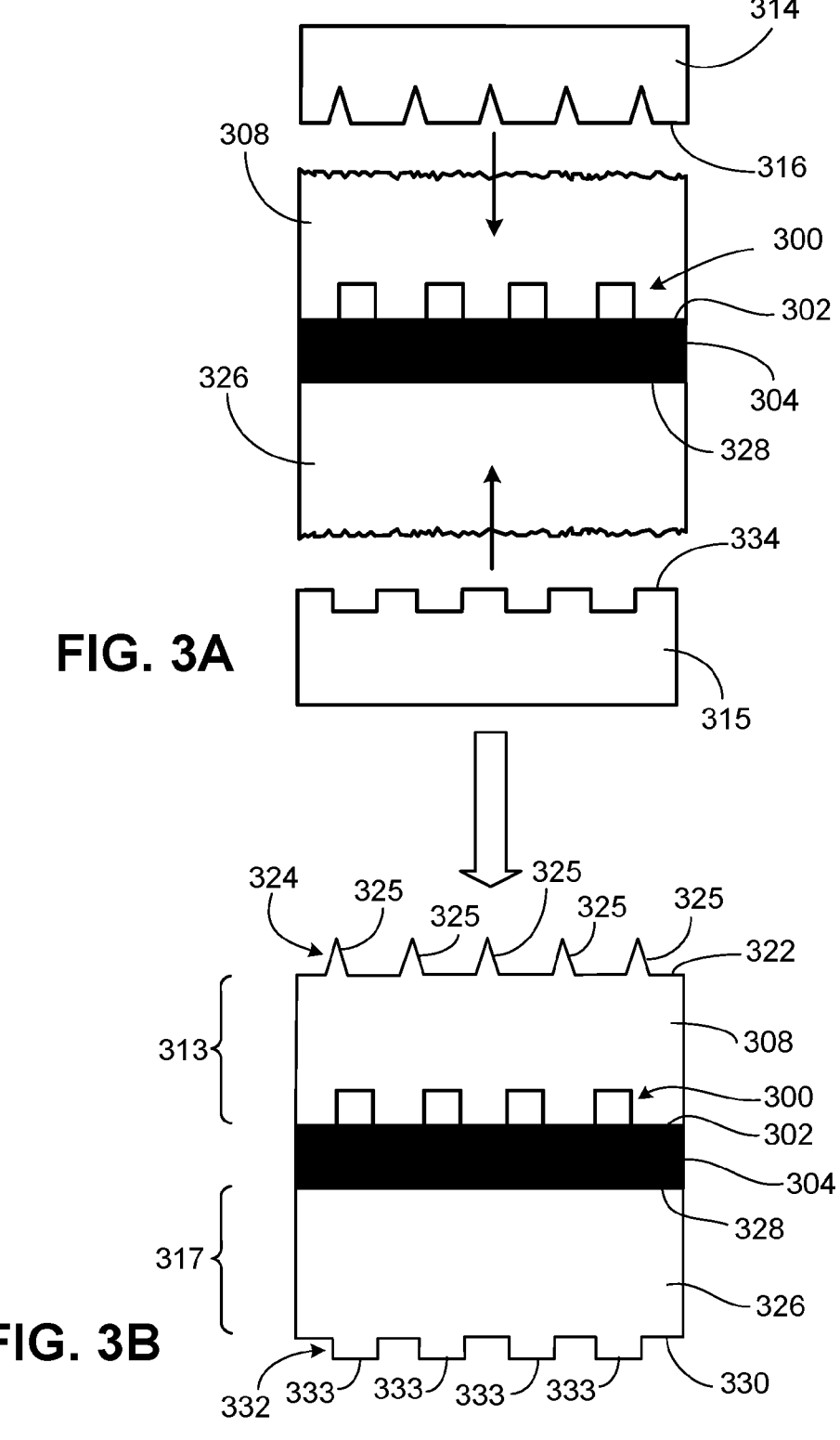
FIGS. 3A-3B are schematics showing examples of imprinting processes on two coatings.

In some implementations, a device includes a respective coating on each of opposite sides of a substrate. As shown in the example of FIG. 3A, a metasurface 300 is on a first substrate surface 302 of a substrate 304. A first coating 308 is on the metasurface 300 and the first substrate surface 302, and a second coating 326 is on a second, opposite substrate surface 328. The coatings 308 and 326 may have been deposited using, for example, the methods described above for coating 108. In some implementations, the coatings 308 and 326 are deposited simultaneously using, for example, a dip-coating method.

Stamps 314, 315, having respective stamp faces 316, 334, are used to imprint the coatings 308 and 326, as described above. In some implementations, the stamps 314, 315 are implemented using the same stamp, and the imprinting of the respective substrate surfaces 302, 328 is performed serially. In some implementations, the stamps 314, 315 are different stamps. In some implementations, the imprinting of the respective substrate surfaces 302, 328 is performed simultaneously.

FIG. 3B shows a device including coatings 308 and 326 on both substrate surfaces 302, 328, in which the coatings 308, 326 have respective coating surfaces 322, 330, each of which has a respective predetermined characteristic. The coating surfaces 322, 330 define respective patterned structures 324, 332. The patterned structures 324, 332 include, respectively, features 325, 333. In some implementations, the stamp faces 316, 334 are substantially the same as one another, such that the features 325, 333 and the patterned structures 324, 332 are substantially the same as one another and have substantially the same functionalities as one another. In some implementations, as shown in FIGS. 3A-3B, the stamp faces 316, 334 are different, and the resulting patterned structures 324, 332 include different features.

Each patterned structure 324, 332 may have a functionality, as described above in reference to FIG. 2B. The respective functionalities may be the same as or different from one another.

In some implementations, the coatings 308, 326 have respective defined thicknesses 313, 317, which may be the same as or different from one another.

Providing coatings on both substrate surfaces such that the coatings have surfaces with predetermined characteristics can improve the functioning of the device. Potential benefits of a coating on the metasurface 300 are described above. The second coating 326 on the second substrate surface 328 also may provide benefits. For example, the coating surface—may include an anti-reflection functionality. The coating surface—may include a hydrophobic functionality, and/or the second coating 326 may be chemically and/or physically resistant, to protect the substrate 304 and, by extension, the metasurface 300. The coating surface—may have other optical functionalities, as described above.

Although FIGS. 3A-3B show a metasurface on only the first substrate surface—302, in some implementations metasurfaces may be on both substrate surfaces—302, 328.

Figures 4, 5A, 5B:
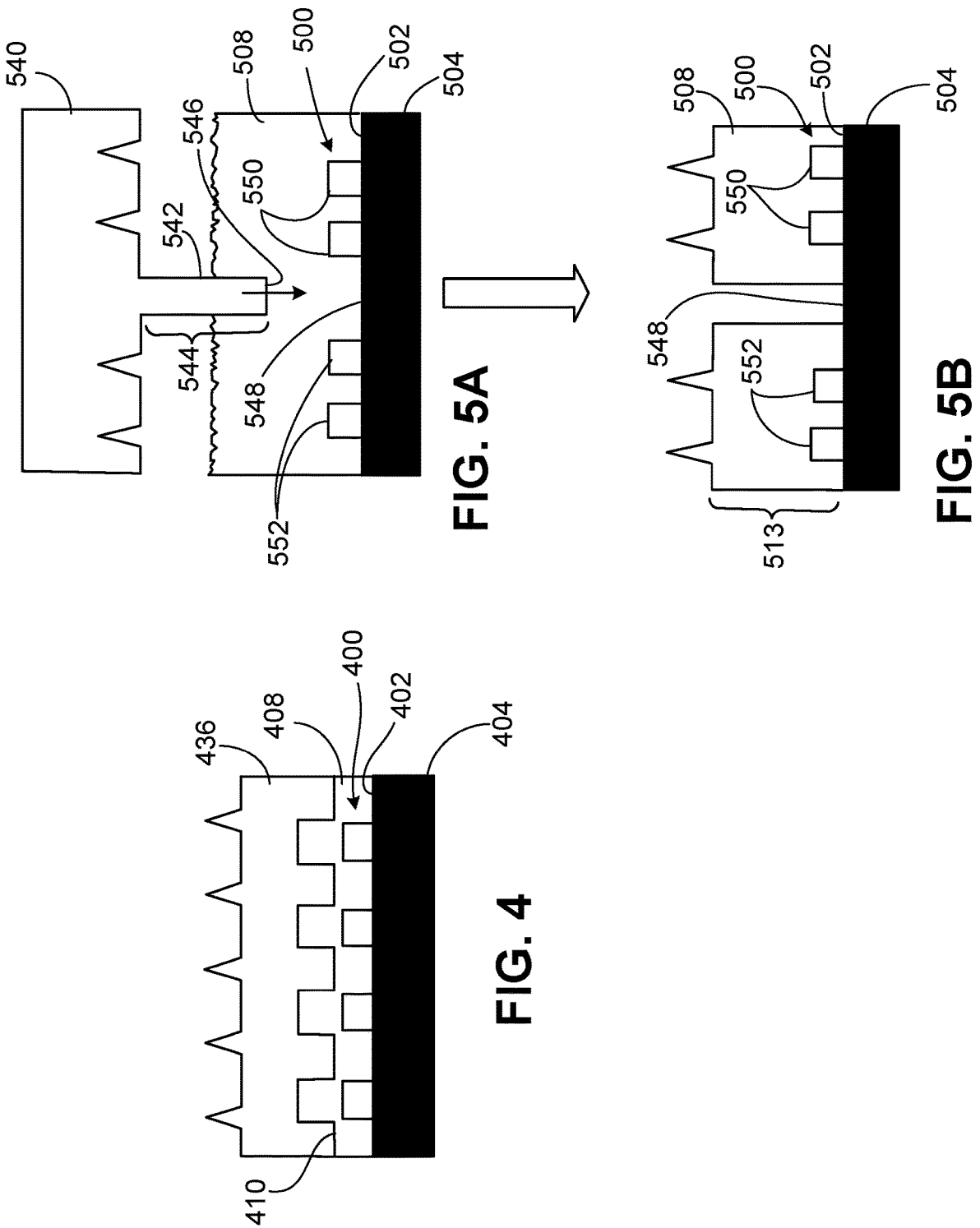
FIG. 4 is a schematic showing an example of two coatings on a metasurface.
FIGS. 5A-5B are schematics showing an example of an imprinting process using a spacer.

In some implementations, as shown in FIG. 4, a device includes multiple coatings on a substrate surface. A metasurface 400 is on a substrate surface 402 of a substrate 404. A first coating 408 is on the metasurface 400 and on the substrate surface 402, and a second different coating 436 is on the first coating 408.

In some implementations, each coating 408, 436 is provided and processed as described above. For example, the first coating 408 may be spin-coated on and then imprinted, and then the second coating 436 may be spin-coated on and then imprinted. Either or both of the coatings 408, 436 may have a surface with a predetermined characteristic.

However, in some implementations the coatings 408, 436 are provided and/or processed in different ways. For example, in some implementations, the first coating 408 is a thin anti-reflection coating. For example, the first coating 408 may include silicon oxide or silicon nitride and be, for example a quarter-wavelength anti-reflection coating. In some implementations, the first coating 408 includes multiple layers.

In some implementations, the coatings 408, 436 are composed of different materials from one another. In some implementations, the coatings 408, 436 have similar indexes of refraction. In some implementations, the coatings 408, 436 have different indexes of refraction and may, for example, together form a multilayer anti-reflection coating. In some implementations, the coatings 408, 436 together form a bandpass optical filter, a high or low optical filter, a notch optical filter, or a line optical filter.

In some implementations, the first coating 408 is deposited by a vapor deposition technique, e.g., chemical vapor deposition or atomic layer deposition. At least because vapor deposition may result in conformal films with approximately constant thicknesses in reference to an underlying structure, the surface 410 of the first coating 408 may be relatively rough, e.g., have a roughness above a desired maximum roughness, or have thickness variations. As described above, this may compromise device operability and/or safety. The first coating 408 may have a relatively high roughness or thickness variations even when the first coating 408 is not deposited by a vapor deposition technique.

The second coating 436 (e.g., a polymer) may be provided and made to have a surface—with a predetermined characteristic, e.g., by imprinting the second coating 436. The predetermined characteristic, as described above, may be one or more of a roughness less than the desired maximum roughness, a structure with an optical function, a structure with a non-optical function, and a structure with a particular feature size. Therefore, in some cases, regardless of possible thickness variations and roughness of the first coating 408, the second coating—436 can improve the optical functioning of the device.

In some implementations, multiple coatings may be on one or more surfaces of a substrate that has at least one coating on multiple surfaces, and/or more than two coatings may be on a substrate surface. For example, one or more additional coatings may be on coatings 308 and 326 in FIG. 3B.

In some implementations, a spacer is provided to define a coating thickness. As shown in FIGS. 5A-5B, a metasurface 500 is on a substrate surface 502 of a substrate 504. A coating 508 is on the metasurface 500 and on the substrate surface 502. A stamp 540 includes a spacer 542 with a height 544.

In some implementations, the spacer 542 is composed of the same material as the rest of the stamp—540. In some implementations, the spacer 542 is composed of a different material. The spacer 542 may be designed so as not to deform or fracture under pressures the spacer may undergo during imprinting.

When the stamp 540 is used to imprint the coating 508, a distal end 546 of the spacer 542 is brought into contact with the substrate surface 502. Therefore, after imprinting, the coating 508 has a thickness 513 that is substantially equal to the height 544 of the spacer 542. The use of one or more spacers can help increase coating thickness uniformity across the substrate 504.

In some implementations, the portion 548 of the substrate surface 502 that contacts the spacer 542 is left, after the imprinting, with very little or no coating 508. This feature may optically isolate portions of the metasurface 500 that are on different sides of the portion 548.

In some implementations, the stamp 540 includes multiple spacers 542 positioned, for example, at intervals across the stamp 540. The presence of multiple spacers 542 may, for example, allow a coating on a large substrate to be imprinted, with a common coating thickness achieved across the substrate. In some implementations, as shown in FIGS. 5A-5B, the stamp 540 is aligned with the substrate 504 such that the portion 548 of the substrate surface 502 that the spacer 542 contacts has no metasurface 500.

In some implementations, the portion 548 defines a line between separate devices, e.g., the nanostructures 550 may be part of a first device, and the nanostructures 552 may be part of a second device. In some implementations, the portion 548 may be aligned with a dicing track.

In some implementations, the stamp 540 includes trenches near the spacer 542. During imprinting, the trenches may provide a space into which excess coating material may be directed. Because the trenches may be positioned between devices (e.g., in the portion 548), an accumulation of coating material at the trenches may not impair device functioning.

Figures 6A, 6B:
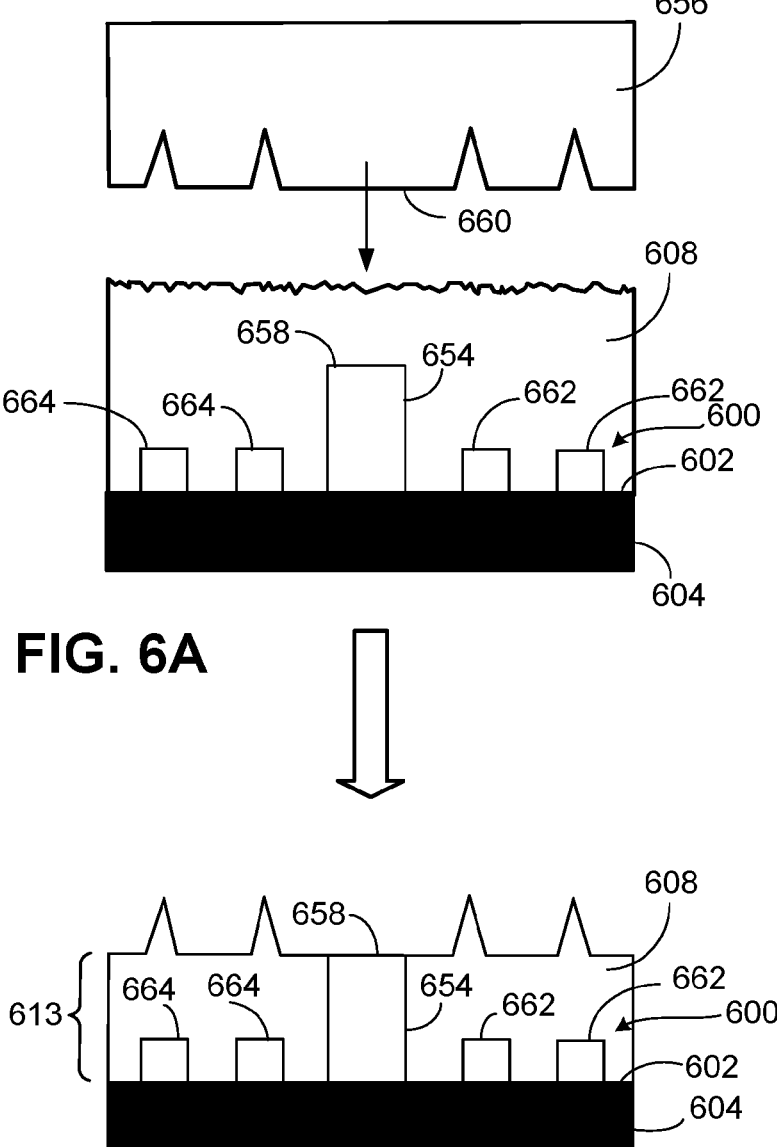
FIGS. 6A-6B are schematics showing another example of an imprinting process using a spacer.

In some implementations, as shown in FIGS. 6A-6B, a spacer 654 is provided on a substrate 604. A metasurface 600 is on a substrate surface 602, and a coating 608 is on the metasurface 600 and on the substrate surface 602. The spacer 654 may be formed as part of a fabrication process that also forms the metasurface 600. In some implementations, the spacer 654 is formed during a separate process from the metasurface 600.

A stamp 656 is used to imprint the coating 608 such that a distal end 658 of the spacer 654 is brought into contact with a face 660 of the stamp 656. After imprinting, the coating 608 has a thickness 613 that is substantially equal to a height of the spacer 654. The use of one or more spacers can help increase coating thickness uniformity across the substrate 604.

In some implementations, the substrate 604 includes multiple spacers 654 positioned, for example, at intervals across the substrate 604. In some implementations, the spacer 654 defines a line between separate devices, e.g., the nanostructures 662 may be part of a first device, and the nanostructures 664 may be part of a second device. In some implementations, the spacer 654 may be aligned with a dicing track.

In some implementations, the stamp 656 includes trenches configured to be positioned near the spacer 654. During imprinting, the trenches may provide a space into which excess coating material may be directed. Because the trenches may be positioned between devices, an accumulation of coating material at the trenches may not impair device functioning.

The methods and devices shown in FIGS. 5A-6B, which include spacers, may be combined with the previously-shown methods and devices. For example, imprinting with a spacer may cause a coating surface to have a particular roughness. Imprinting with a spacer may be performed on either or both of two coatings on two respective opposite surfaces of a substrate that has a metasurface on at least one of its surfaces. Either or both of the two opposite surfaces of the substrate may include one or more respective spacers. Imprinting with a spacer may be performed on one or more coatings in a multi-coating stack.

Figure 7:
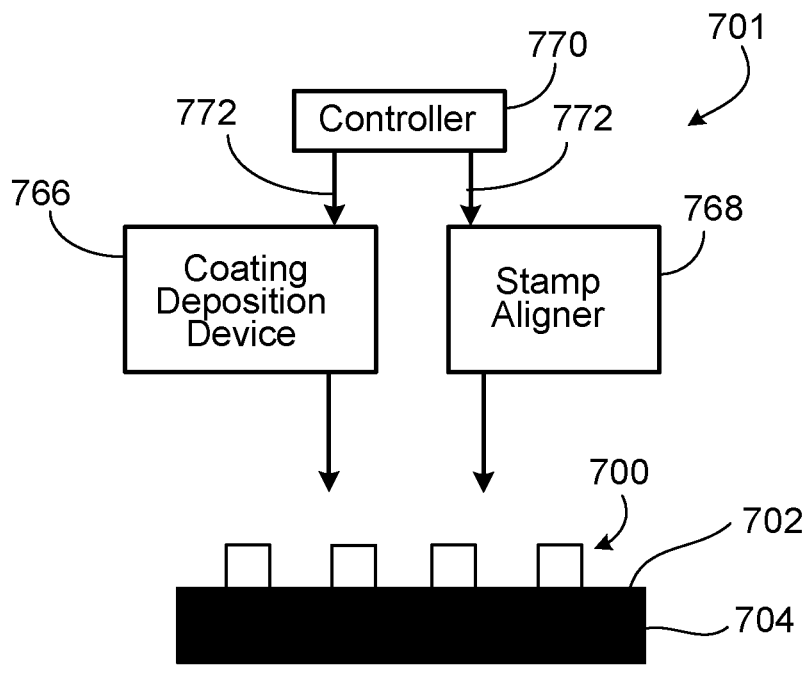
FIG. 7 is a block diagram of an example of a system for performing an imprinting process.

The methods and devices described in this disclosure may be implemented in systems. FIG. 7 shows an example of a system 701 that includes a metasurface 700 on a substrate surface 702 of a substrate 704. A coating deposition device 766 is operable to deposit a coating on the substrate. A stamp aligner 768 is operable to align a stamp with the substrate— 704 and perform imprinting on the coating. The coating deposition device 766 and the stamp aligner 768 are configured to perform at least the methods described above. A controller 770 is operable to communicate with one or both of the coating deposition device 766 and the stamp aligner 768 and to transmit instructions 772 to perform the deposition and/or imprinting processes.

In some implementations, alignment is performed in reference to the metasurface 700. In some implementations, alignment is performed in reference to spacers on the substrate (not shown in FIG. 7). In some implementations, alignment is performed in reference to other features on the substrate, which may be formed, for instance, by photolithography. In some implementations, the alignment and/or imprinting is automated (e.g., performed by the stamp aligner 768). The controller 770 may be programmed with process parameters, e.g., a spin frequency to be used for spinning on the coating, or a pressure to apply during the imprinting process. In some implementations, one or more steps are performed manually.

In some implementations, a silicon wafer having a metasurface on a first wafer surface is moved along an assembly line. The wafer is dipped into a vat containing a liquid polymer, resulting in a coating on each of the first wafer surface and a second, opposite wafer surface. The wafer is held in place while a stamp aligner scans the first wafer surface for alignment features, aligns a hot first stamp based on the alignment features, and brings the first stamp down towards the first wafer surface with a predetermined pressure. A spacer on the first stamp sets a final height of the coating on the first wafer surface, and features on a face of the first stamp cause a surface of the coating on the first wafer surface to include textured pyramids that decrease reflection of incident light.

In the example process, the wafer then is rotated (e.g., by robotic arms), and the stamp aligner, or a different stamp aligner, performs a second imprinting process on the coating on the second wafer surface. A second stamp and parameters of the second imprinting process may be the same as or different from the first stamp and parameters of the first printing process.

In the example process, after completion of the two imprinting processes, the wafer is passed through a UV chamber to cure the two coatings. The underlying metasurface is now protected by the coatings, and, in addition, the coatings provide additional functionality. The wafer may then be diced into individual devices.

Figure 8:
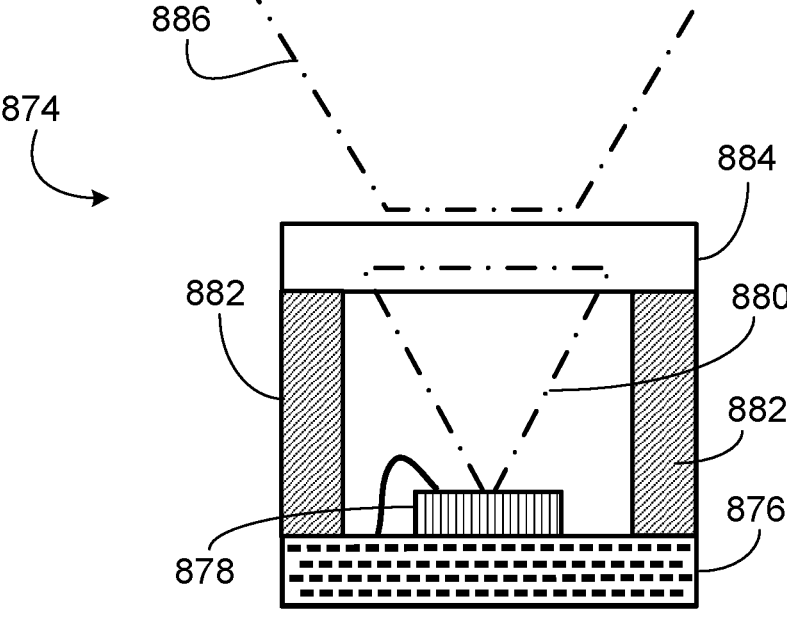
FIG. 8 is a schematic showing an example of a module.

In some implementations, devices incorporating one or more metasurfaces and one or more coatings on the metasurfaces, as described above, may be integrated into modules. As shown in FIG. 8, a module 874 includes a substrate 876 and a light-emitting component 878 coupled to or integrated into the substrate 876. The light-emitting component 878 may include, for example, a laser (for example, a vertical-cavity surface-emitting laser) or a light-emitting diode.

Light 880 generated by the light-emitting component 878 is transmitted through a housing and then to a coated-metasurface device 884. The coated-metasurface device 884 is operable to, as described above, modify the light 880, such that modified light 886 is transmitted out of the module 874. For example, the module 874, using the coated-metasurface device 884, may produce one or more of structured light, diffused light, and patterned light. The housing may include, for example, spacers 882 separating the light-emitting component 878 and/or the substrate 876 from the coated-metasurface device When integrated into the module 874, the coated-metasurface device 884 may provide advantages over devices without a coated metasurface. For example, the coating on the metasurface may enhance eye safety by reducing effects of contaminants on a surface of the device 884. The coating may make the module 874 more efficient by having an anti-reflection function, such that the generated light 880 is less likely to be reflected and more likely to be transmitted as the modified light 886. The coating may make the module 874 more stable by protecting the device 884 in adverse environments. The coating may have an optical function that acts to modify the light 880 to produce the modified light 886. The coating may allow the device 884 to be thinner than if discrete optical components replaced the coating, saving space in the module 874 and/or decreasing a total necessary size of the module 874.

In some implementations, the module 874 of FIG. 8 is a light-sensing module (for example, an ambient light sensor), the component 878 is a light-sensing component (for example, a photodiode, a pixel, or an image sensor), the light 886 is light incident on the module 874, and the light 880 is light modified by the coated-metasurface device 884. For example, the coated-metasurface device 884 may focus patterned light onto the light-sensing component 878. As described above, the coating on the coated-metasurface device 884 may reduce a size of the module 874 compared to conventional optics, may protect the device 884 in adverse environments, and may increase a detection efficiency of the module 874 by decreasing an amount of reflected light.

In some implementations, the module 874 may include both light-emitting and light-sensing components. For example, the module 874 may emit light that interacts with an environment of the module 874 and is then received back by the module 874, allowing the module 874 to act, for example, as a proximity sensor or as a three-dimensional mapping device. When integrated into such a module, the coated-metasurface device may provide the advantages described for the modules above.

The modules described above may be part of, for example, time-of-flight cameras and active-stereo cameras. The modules may be integrated into systems, for example, mobile phones, laptops, wearable devices, and automotive vehicles.

In accordance with the implementations of this disclosure, improved methods and devices are described for depositing a coating over a metasurface and imprinting the coating to cause a surface of the coating to have a predetermined characteristic.

Various aspects of the subject matter and the functional operations described in this specification can be implemented in digital electronic circuitry, or in computer software, firmware, or hardware, including the structures disclosed in this specification and their structural equivalents, or in combinations of one or more of them. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Although particular implementations have been described in detail, various modifications can be made. As one example, the processes depicted in the figures do not necessarily require the particular order shown, or sequential order, to achieve desirable results. In certain implementations, multitasking and parallel processing may be advantageous. Accordingly, other implementations are within the scope of the claims.

What is claimed is:

1. An apparatus comprising a device comprising:
   a substrate;
   a metasurface on a first surface of the substrate; and
   a coating on the metasurface and on the first surface of the substrate, a surface of the coating defining a functional structure comprising a diffractive optical structure, an optical lens, a hydrophobic structure or a hydrophilic structure.

2. The apparatus of claim 1, wherein the functional structure comprises an anti-reflection structure.

3. The apparatus of claim 1, wherein the functional structure comprises features having a dimension between 10 nm and 100 nm.

4. The apparatus of claim 1, wherein the coating comprises a polymer.

5. The apparatus of claim 1, wherein the metasurface comprises nanostructures operable to interact with a light wave so as to change at least one of an amplitude or a phase of the light wave.

6. The apparatus of claim 1, wherein the surface of the coating has a roughness that is less than a predetermined maximum roughness.

7. The apparatus of claim 1, comprising:

a second coating on a second surface of the substrate, the second surface of the substrate being on an opposite side of the substrate from the first surface of the substrate, wherein a surface of the second coating defines a second functional structure.

8. The apparatus of claim 1, wherein the coating has a thickness of greater than 10 microns.

9. The apparatus of claim 1 further comprising:

a light-emitting device, wherein the device that has the metasurface is configured to interact with light generated by the light-emitting device.

10. The apparatus of claim 1 further comprising:

a light-sensitive device, wherein the device that has the metasurface is configured to interact with light incident on the device that has the metasurface, and to transmit modified light to the light-sensitive device.

\* \* \* \* \*